(12) United States Patent  (10) Patent No.: US 8,861,252 B2
Ito  (45) Date of Patent: Oct. 14, 2014

(54) RESET CIRCUIT FOR RESISTIVE MEMORY DEVICE

(75) Inventor: Hiroshi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 395 days.

(21) Appl. No.: 13/234,491

(22) Filed: Sep. 16, 2011

(65) Prior Publication Data

US 2012/0069628 A1  Mar. 22, 2012

(30) Foreign Application Priority Data

Sep. 22, 2010 (JP) .................................. 2010-212626

(51) Int. Cl.
*G11C 11/00* (2006.01)
*G11C 13/00* (2006.01)

(52) U.S. Cl.
CPC ........ *G11C 13/0007* (2013.01); *G11C 2213/71* (2013.01); *G11C 13/0064* (2013.01); *G11C 2213/72* (2013.01); *G11C 2013/0066* (2013.01); *G11C 2013/0078* (2013.01); *G11C 13/0002* (2013.01); *G11C 13/0069* (2013.01)
USPC ........... 365/148; 365/158; 365/163; 365/171; 365/173

(58) Field of Classification Search
CPC ........................................ G11C 13/00
USPC ........................... 365/148, 158, 163, 171, 173
See application file for complete search history.

(56) References Cited

U.S. PATENT DOCUMENTS

| 2009/0122598 A1* | 5/2009 | Toda et al. ..................... 365/158 |
| 2009/0213639 A1* | 8/2009 | Toda ............................. 365/148 |
| 2009/0279344 A1 | 11/2009 | Toda |
| 2009/0323394 A1* | 12/2009 | Scheuerlein .................. 365/148 |
| 2011/0051495 A1 | 3/2011 | Ito |

FOREIGN PATENT DOCUMENTS

| JP | 2009-271999 | 11/2009 |
| JP | 2010-92568 A | 4/2010 |
| WO | WO 2008/012871 A1 | 1/2008 |

OTHER PUBLICATIONS

Office Action issued Nov. 6, 2012 in Japanese Patent Application No. 2010-212626.

* cited by examiner

*Primary Examiner* — Tha-O H Bui
(74) *Attorney, Agent, or Firm* — Oblon, Spivak, McClelland, Maier & Neustadt, L.L.P.

(57) ABSTRACT

According to one embodiment, a nonvolatile semiconductor memory device comprises a memory cell which includes a variable resistance element and a current-limiting element that has a nonlinear current-voltage characteristic and a driver which changes the resistance of the variable resistance element by causing a first current to flow in the memory cell. In addition, the nonvolatile semiconductor memory device further comprises a detection module which detects a change in the resistance of the memory cell based on the magnitude of the first current and a current supplying module which causes a second current to flow in the detection module in place of the first current.

17 Claims, 8 Drawing Sheets

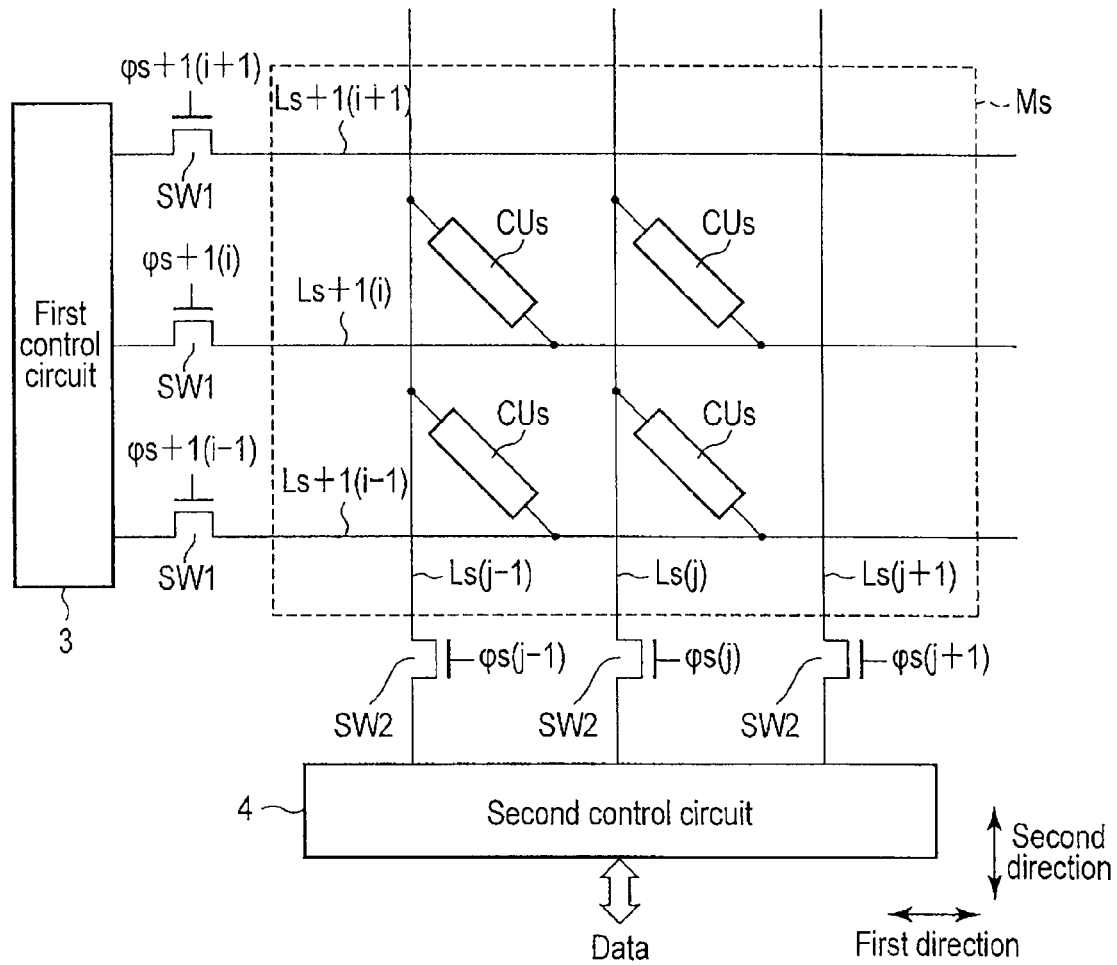
F I G. 3

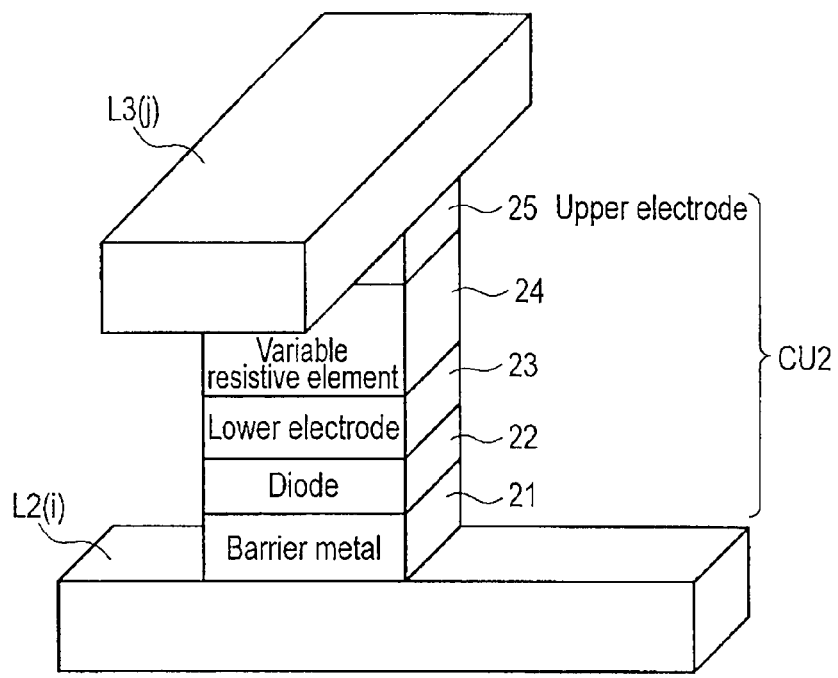
F I G. 4
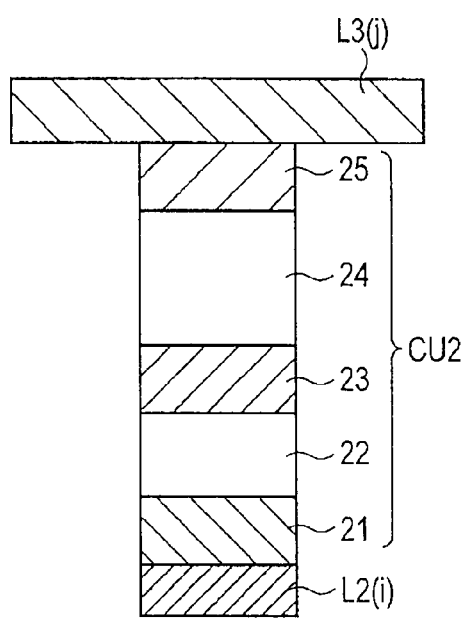
F I G. 5

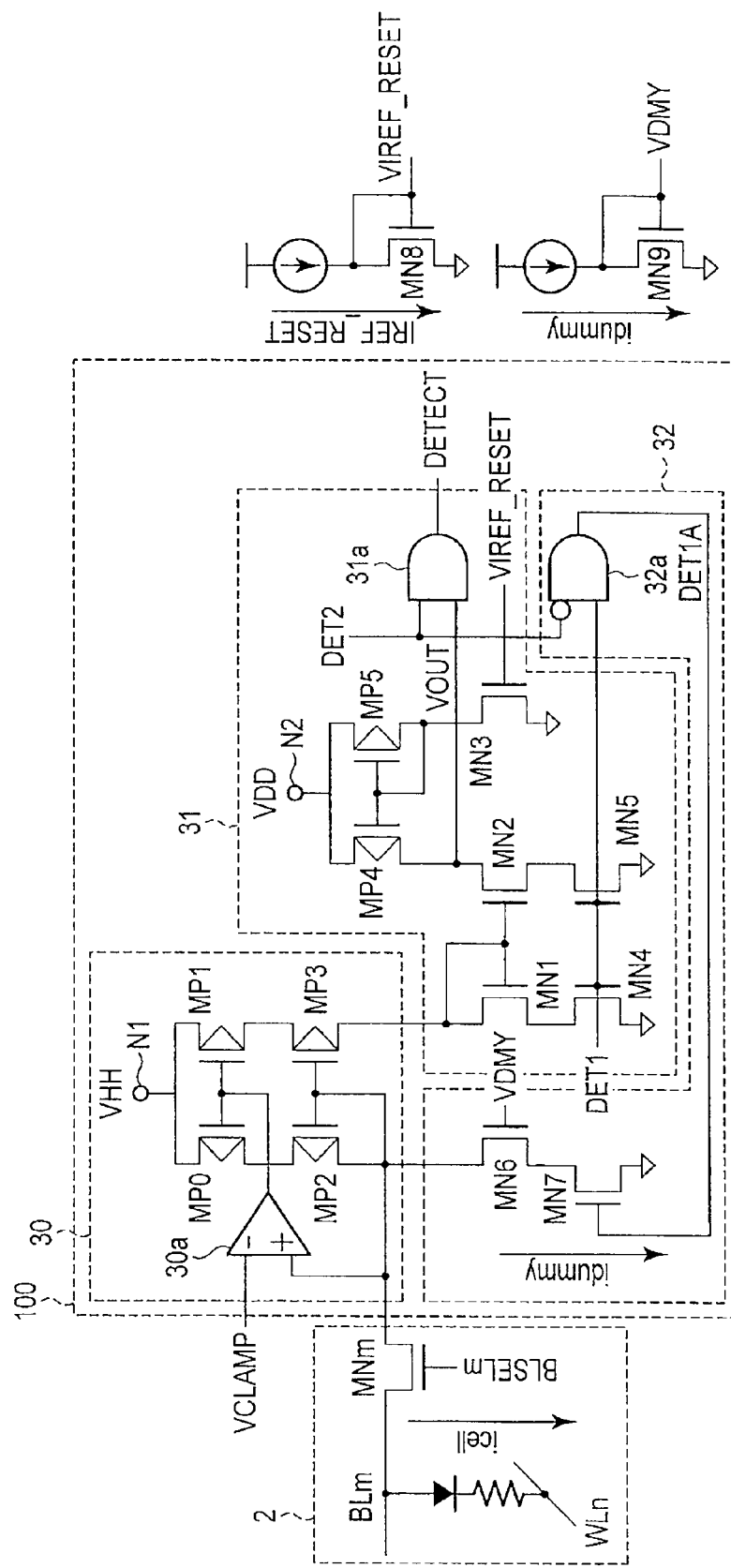
F I G. 6A
F I G. 6B

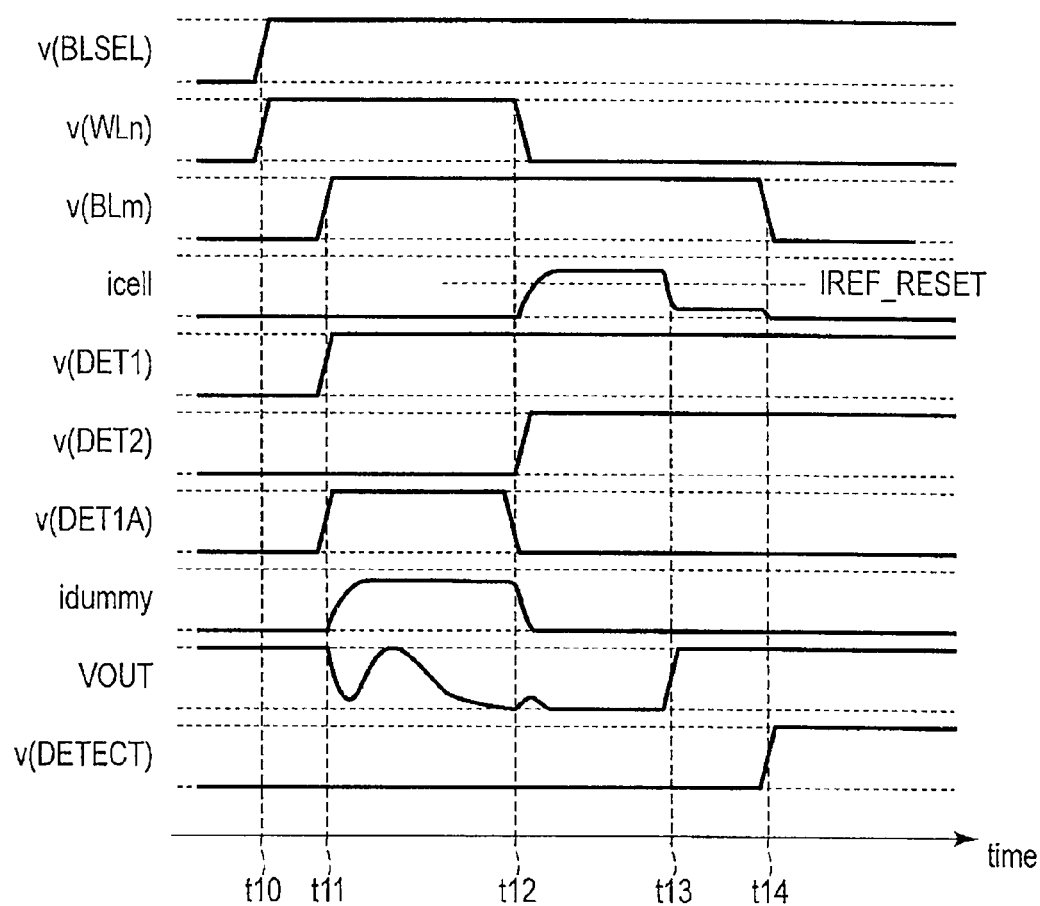
F I G. 7

RESET CIRCUIT FOR RESISTIVE MEMORY DEVICE

CROSS-REFERENCE TO RELATED APPLICATIONS

This application is based upon and claims the benefit of priority from prior Japanese Patent Application No. 2010-212626, filed Sep. 22, 2010, the entire contents of which are incorporated herein by reference.

FIELD

Embodiments described herein relate generally to a nonvolatile semiconductor memory device and a method of controlling the nonvolatile semiconductor memory device.

BACKGROUND

In recent years, an attempt has been made to further miniaturize a nonvolatile semiconductor memory device with memory elements each composed of a MOS transistor with a floating gate and to make higher the capacity of the nonvolatile semiconductor memory device. To realize the miniaturization and higher capacity, a next-generation nonvolatile semiconductor memory device using new materials and a different operating principle is being developed. A resistance-change memory has been considered as such a next generation nonvolatile semiconductor memory device.

A magnetoresistive random access memory (MRAM) using a tunnel magnetoresistive effect produced by a magnetic tunnel junction, a phase-change random access memory (PRAM) making use of the fact that a chalcogenide semiconductor phase-transits from a crystal phase to an amorphous phase or vice versa by Joule heat produced by current and the resistance in one phase differs greatly from that in the other phase, and the like have been developed. In addition, the development of new memories using other resistance-change materials and operating principles is on the rise. Those memories are generically called resistive random access memories (ReRAMs).

BRIEF DESCRIPTION OF THE DRAWINGS

FIG. 3 is a diagram showing a layout of a first and a second control circuit according to the embodiment;

FIG. 4 is a perspective view schematically showing a memory cell structure according to the embodiment;

FIG. 5 is a sectional view schematically showing a memory cell structure of the embodiment;

FIG. 6A is a circuit diagram schematically showing a basic configuration of a resistance-change detection circuit according to the embodiment and FIG. 6B is a circuit diagram schematically showing a basic configuration of a VIREF_RESET bias generator circuit and a VDMY bias generator circuit according to the embodiment;

FIG. 7 is a timing chart for the resistance-change detection circuit shown in FIGS. 6A and 6B;

DETAILED DESCRIPTION

In general, according to one embodiment, a nonvolatile semiconductor memory device comprises a memory cell which includes a variable resistance element and a current-limiting element that has a nonlinear current-voltage characteristic and a driver which changes the resistance of the variable resistance element by causing a first current to flow in the memory cell. In addition, the nonvolatile semiconductor memory device further comprises a detection module which detects a change in the resistance of the memory cell based on the magnitude of the first current and a current supplying module which causes a second current to flow in the detection module in place of the first current.

Hereinafter, an embodiment will be explained in detail with reference to the accompanying drawings.

The embodiment explained below is related to an ReRAM which uses a variable resistance element as a memory element. Here, a variable resistance element is an element made of a material whose resistance varies with voltage, current, heat, or the like.

In this specification, for example, metallic oxide, a metallic compound, an organic thin film, carbon, a carbon nanotube, or the like is prepared as the variable resistance element. They are elements whose resistance can be electrically changed reversibly.

Here, one method of changing the resistance of a memory element is to change the resistance of a memory element at least between a first value and a second value in a reversible manner by controlling the magnitude of voltage or current and the applying time without changing the polarity of the voltage applied to the memory element. Another method of changing the resistance of a memory element is to change the resistance of a memory element at least between a first value and a second value in a reversible manner by changing the polarity of the voltage applied to the memory element. The former is called a unipolar operation and the latter is called a bipolar operation.

(1) Overall View

Figure 1:
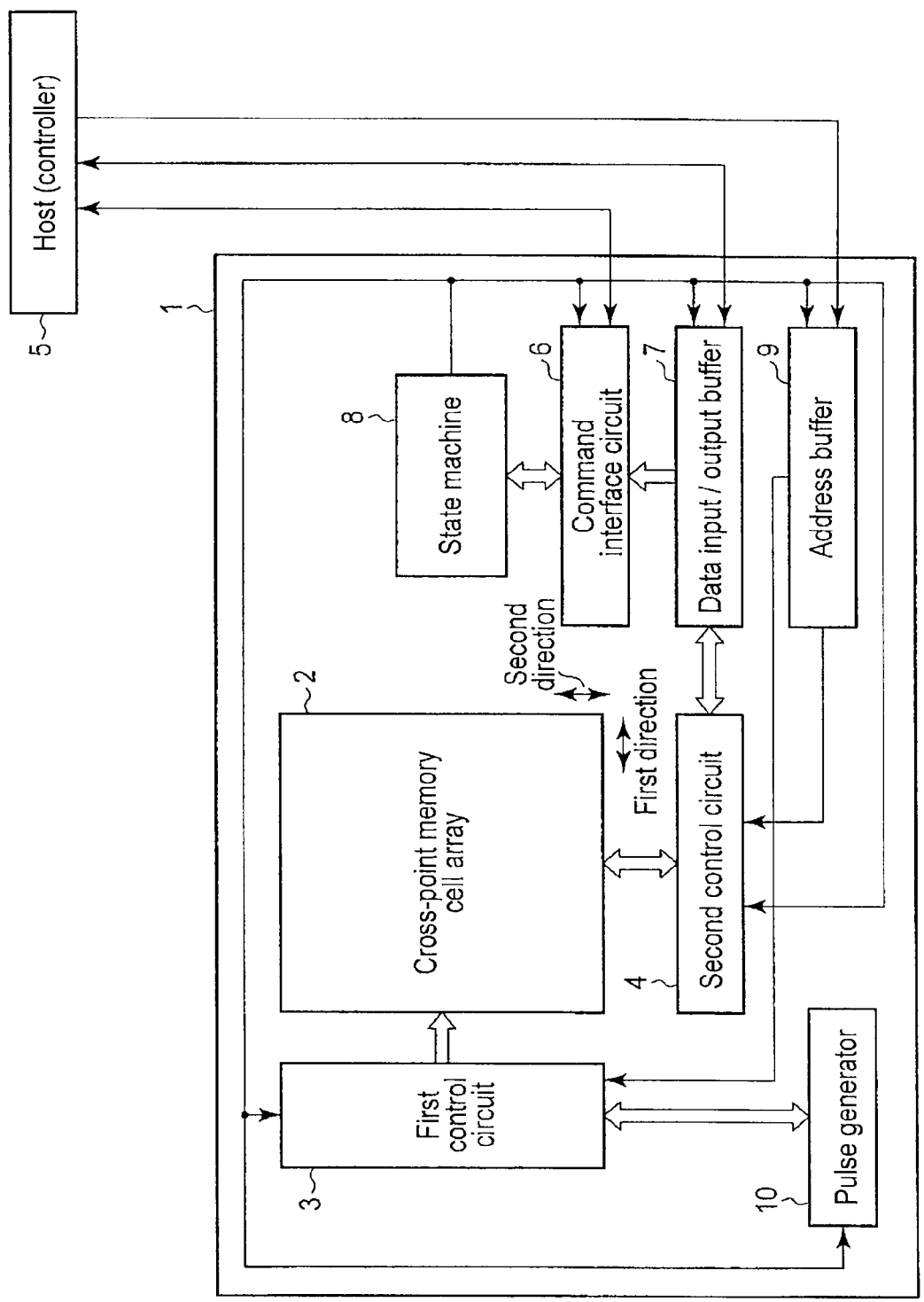
FIG. 1 is a block diagram schematically showing a basic configuration of a resistance-change memory according to an embodiment.

FIG. 1 shows a main part of a resistance-change memory (a resistance-change memory device). As shown in FIG. 1, the resistance-change memory 1 comprises a cross-point memory cell array 2, a first control circuit 3, a second control circuit 4, a command interface circuit 6, a data input/output buffer 7, a state machine 8, an address buffer 9, and a pulse generator 10.

The resistance-change memory 1 receives a control signal and data from an external host 5 and operates according to the control signal and data. While in the embodiment, the host 5 is located outside the resistance-change memory 1, it may be provided inside the resistance-change memory 1.

The cross-point memory cell array 2 is configured to have a stack structure composed of a plurality of memory cell arrays. The cross-point type means a structure where memory cells are formed at the intersections of a plurality of interconnections arranged in parallel and another plurality of interconnections arranged in parallel so as to cross the interconnections at right angles in multiple levels. A memory cell of the embodiment includes a variable resistance element. The memory cell holds data, depending on whether the variable resistance element holds either a low-resistance state or a high-resistance state. The structure of the memory cell will be described later.

The first control circuit 3 is arranged to one end side of the cross-point memory cell array 2 in a first direction. The second control circuit 4 is arranged to one end side of the cross-point memory cell array 2 in a second direction perpendicular to the first direction.

The first and second control circuits 3, 4 select at least one of the memory cell arrays stacked one on top of another on the basis of, for example, a memory cell array selection signal.

The first control signal 3 selects a row in the cross-point memory cell array 2 on the basis of, for example, a row address signal. The second control signal 4, which includes a resistance-change detection circuit, selects a column in the cross-point memory cell array 2 on the basis of, for example, a column address signal.

The first and second control circuits 3, 4 control the writing/reading of data into/from a memory element in the cross-point memory cell array 2.

The first and second control circuits 3, 4 can write/read data into/from one of the stacked memory cell arrays. In addition, the first and second control circuits 3, 4 can write/read data into/from at least two or all of the stacked memory cell arrays simultaneously.

In writing data into a memory cell, the first and second control circuits 3, 4 change the memory cell from the high-resistance state to the low-resistance state or vice versa. Hereinafter, the operation of changing the memory cell from the high-resistance state to the low-resistance state is called a SET and the operation of changing the memory cell from the low-resistance state to the high-resistance state is called a RESET. In a SET and a RESET, if the voltage or the direction of current is the same, the operation is called a unipolar operation. In a SET and a REST, if the voltage or the direction of current is reversed, the operation is called a bipolar operation. The resistance in a SET state has only to differ from that in a RESET state.

If in a SET operation, one of a plurality of resistances is configured to be selectively written, a multilevel resistance-change memory where a memory element stores multilevel data can be realized.

The command interface circuit 6 determines on the basis of a control signal whether data from the host 5 is command data. If the data is command data, the command interface circuit 6 transfers the data from the data input/output buffer 7 to the state machine 8.

The state machine 8 manages the operation of the entire resistance-change memory 1 according to the command data. For example, the state machine 8 manages a set/reset operation and a read operation on the basis of the command data from the host 5. The host 5 can receive status information managed by the state machine 8 and make a determination on the operation result of the resistance-change memory.

The address buffer 9 receives an address signal from the host 5 in a set/reset operation and a read operation. The address signal includes, for example, a memory cell array selection signal, a row address signal, and a column address signal. The address signal is input to the first and second control circuits 3, 4 via the address buffer 9.

The pulse generator 10 outputs, for example, a voltage pulse or a current pulse necessary for a set/reset operation and a read operation on the basis of an instruction from the state machine 8.

(2) Memory Cell Array

Figure 2:
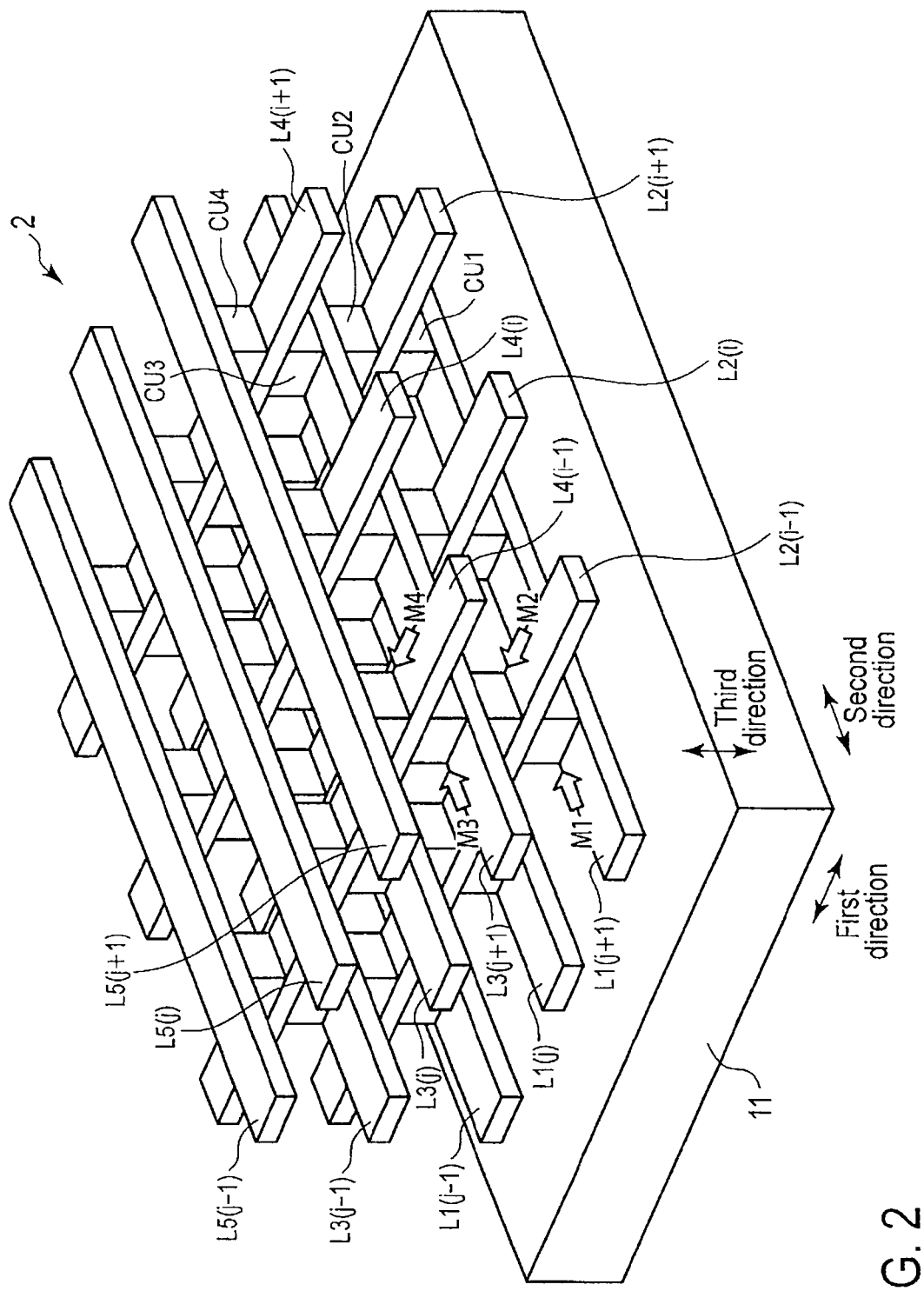
FIG. 2 is a perspective view showing a basic configuration of a cross-point memory cell array according to the embodiment.

Next, the configuration of the cross-point memory cell array 2 will be explained with reference to FIG. 2. FIG. 2 is a perspective view of the cross-point memory cell array 2.

As shown in FIG. 2, the cross-point memory cell array 2 is provided over a semiconductor substrate (e.g., a silicon substrate) 11. Here, a circuit element, such as a MOS transistor, and a dielectric layer may be sandwiched between the cross-point memory cell array 2 and the semiconductor substrate.

While in FIG. 2, the cross-point memory cell array 2 includes four memory cell arrays M1, M2, M3, M4 stacked one on top of another in a third direction (a direction perpendicular to the principal plane of the semiconductor substrate 11) as an example, the number of memory cell arrays stacked is not limited to four.

Memory cell array M1 is composed of a plurality of cell units CU1 (memory cells) arranged in an array in a first and a second direction.

Similarly, memory cell array M2 is composed of a plurality of cell units CU2 arranged in an array, memory cell array M3 is composed of a plurality of cell units CU3 arranged in an array, and memory cell array M4 is composed of a plurality of cell units CU4 arranged in an array.

Each of cell units CU1, CU2, CU3, CU4 is composed of a variable resistance element and a current-limiting element connected in series.

On the semiconductor substrate 11, there are provided conductive lines L1(j−1), L1(j), L1(j+1), conductive lines L2(i−1), L2(i), L2(i+1), conductive lines L3(j−1), L3(j), L3(j+1), conductive lines L4(i−1), L4(i), L4(i+1), conductive lines L5(j−1), L5(j), L5(j+1) in that order from the semiconductor substrate 11 side.

The odd-numbered conductive lines from the semiconductor substrate 11 side, that is, conductive lines L1(j−1), L1(j), L1(j+1), conductive lines L3(j−1), L3(j), L3(j+1), and conductive lines L5(j−1), L5(j), L5(j+1), extend in the second direction.

The even-numbered conductive lines from the semiconductor substrate 11 side, that is, conductive lines L2(i−1), L2(i), L2(i+1) and conductive lines L4(i−1), L4(i), L4(i+1), extend in the first direction.

Those conductive lines function as word lines or bit lines.

A first memory cell array M1 at the lowest level is arranged between first conductive lines L1(j−1), L1(j), L1(j+1) and second conductive lines L2(i−1), L2(i), L2(i+1). In a set/reset operation and a read operation on memory cell array M1, either conductive lines L1(j−1), L1(j), L1(j+1) or conductive lines L2(i−1), L2(i), L2(i+1) are caused to function as word lines and the remaining lines are caused to function as bit lines.

Memory cell array M2 is arranged between second conductive lines L2(i−1), L2(i), L2(i+1) and third conductive lines L3(j−1), L3(j), L3(j+1). In a set/reset operation and a read operation on memory cell array M2, either conductive lines L2(i−1), L2(i), L2(i+1) or conductive lines L3(j−1), L3(j), L3(j+1) are caused to function as word lines and the remaining lines are caused to function as bit lines.

Memory cell array M3 is arranged between third conductive lines L3(j−1), L3(j), L3(j+1) and fourth conductive lines L4(i−1), L4(i), L4(i+1). In a set/reset operation and a read operation on memory cell array M3, either conductive lines L3(j−1), L3(j), L3(j+1) or conductive lines L4(i−1), L4(i), L4(i+1) are caused to function as word lines and the remaining lines are caused to function as bit lines.

Memory cell array M4 is arranged between fourth conductive lines L4(i−1), L4(i), L4(i+1) and fifth conductive lines L5(j−1), L5(j), L5(j+1). In a set/reset operation and a read operation on memory cell array M4, either conductive lines L4(i−1), L4(i), L4(i+1) or conductive lines L5(j−1), L5(j), L5(j+1) are caused to function as word lines and the remaining lines are caused to function as bit lines.

(3) Layout of the First and Second Control Circuits

Next, the first and second control circuits 3, 4 will be explained. FIG. 3 is a block diagram of a memory cell array and the first and second control circuits, showing an example of the layout of them.

A memory cell array Ms (s=any one of 1 to 4) corresponding to any one of memory cell arrays M1, M2, M3, M4 shown in FIG. 2 is composed of a plurality of cell units CUs arranged in an array as shown in FIG. 3. Ends on one side of the cell units CUs are connected to conductive lines Ls(j−1), Ls(j), Ls(j+1) respectively and ends on the other side of the cell units CUs are connected to conductive lines Ls+1(i−1), Ls+1(i), Ls+1(i+1) respectively.

Memory cell array Ms+1 (not shown) is composed of a plurality of cell units CUs+1 arranged in an array. Ends on one side of the cell units CUs+1 are connected to conductive lines Ls+1(i−1), Ls+1(i), Ls+1(i+1) respectively and ends on the other side of the cell units CUs+1 are connected to conductive lines Ls+2(j−1), Ls+2(j), Ls+2(j+1) respectively.

The first control circuit 3 is connected via switch elements SW1 to ends on one side of conductive lines Ls+1(i−1), Ls+1(i), Ls+1(i+1) in the first direction. Each of the switch circuits SW1 is an re-channel field effect transistor (FET) controlled by, for example, control signals φs+1(i−1), φs+1(i), φs+1(i+1).

The second control circuit 4 is connected via switch elements SW2 to ends on one side of conductive lines Ls(j−1), Ls(j), Ls(j+1) in the second direction. Each of the switch circuits SW2 is an n-channel FET controlled by, for example, control signals φs(j−1), φs(j), φs(j+1).

There are various patterns of the connection relation between a memory element and a current-limiting element.

Here, in all the cell units in a memory cell array, the connection relation between a memory cell and a current-limiting element must be the same.

In a cell unit, there are two patterns of positional relation between a memory element and a current-limiting element and two patterns of the direction of a current-limiting element. Therefore, there are four patterns of the connection relation between a memory element and a current-limiting element in total. Accordingly, in a cell unit in two memory cell arrays, there are 16 (4×4) patterns of the connection relation between memory elements and current-limiting elements.

Next, a configuration of a memory cell structure (a cell unit) according to the embodiment will be explained with reference to FIGS. 4 and 5. FIG. 4 is a perspective view schematically showing a memory cell structure according to the embodiment. FIG. 5 is a sectional view schematically showing the memory cell structure of the embodiment. FIGS. 4 and 5 show a cell unit CU2 included in a memory cell array M2 as an example.

As shown in FIGS. 4 and 5, a memory cell structure where a variable resistance element (memory element) 24 acting as a storage layer (resistance-change layer) and a diode (current-limitting element) 22 are stacked one on top of the other is formed between, for example, bit line L2(i) and word line L3(j). More specifically, the memory cell structure, which takes the form of a pillar, comprises a barrier metal (bonding layer) 21 formed on bit line L2(i), a diode (current-limiting element) 22 formed on the barrier metal layer 21, a lower electrode 23 formed on the diode 22, a variable resistance element 24 formed on the lower electrode 23, and an upper electrode (buffer layer) 25 formed between the variable resistance element 24 and word line L3(j).

A heat-resistant, low-resistance material is used as a material for bit line L2(i) and word line L3(j). Concrete interconnection materials include, for example, W, WSi, NiSi, CoSi.

The barrier metal layer 21 is made of, for example, Ti or TiN.

The diode 22, which has a nonlinear current-voltage characteristic, is composed of, for example, a p-i-n diode. The diode 22 may be composed of not only a p-i-n diode but also various diodes, including a p-n junction diode and a Schottky diode, and a metal-insulator-metal (MIM) structure and a silicon-insulator-silicon (SIS) structure.

The lower electrode 23 and upper electrode are made of, for example, Pt, Au, Ag, TiAlN, SrRuO, Ru, RuN, Ir, Co, Ti, TiN, TaN, LaNiO, Al, PtIrOx, PtRhOx, Rh, or TaAlN.

The variable resistance element 24 is made of, for example, transition metal oxide, such as hafnia, zirconia, nickel oxide, manganese oxide, titania, or tantalum oxide, or of metal oxide obtained by doping these transition metal oxide with a suitable additive.

The positions of the variable resistance element 24 and diode 23 may be reversed.

(4) Comparative Example of the Second Control Circuit 4

Figures 8A, 8B:
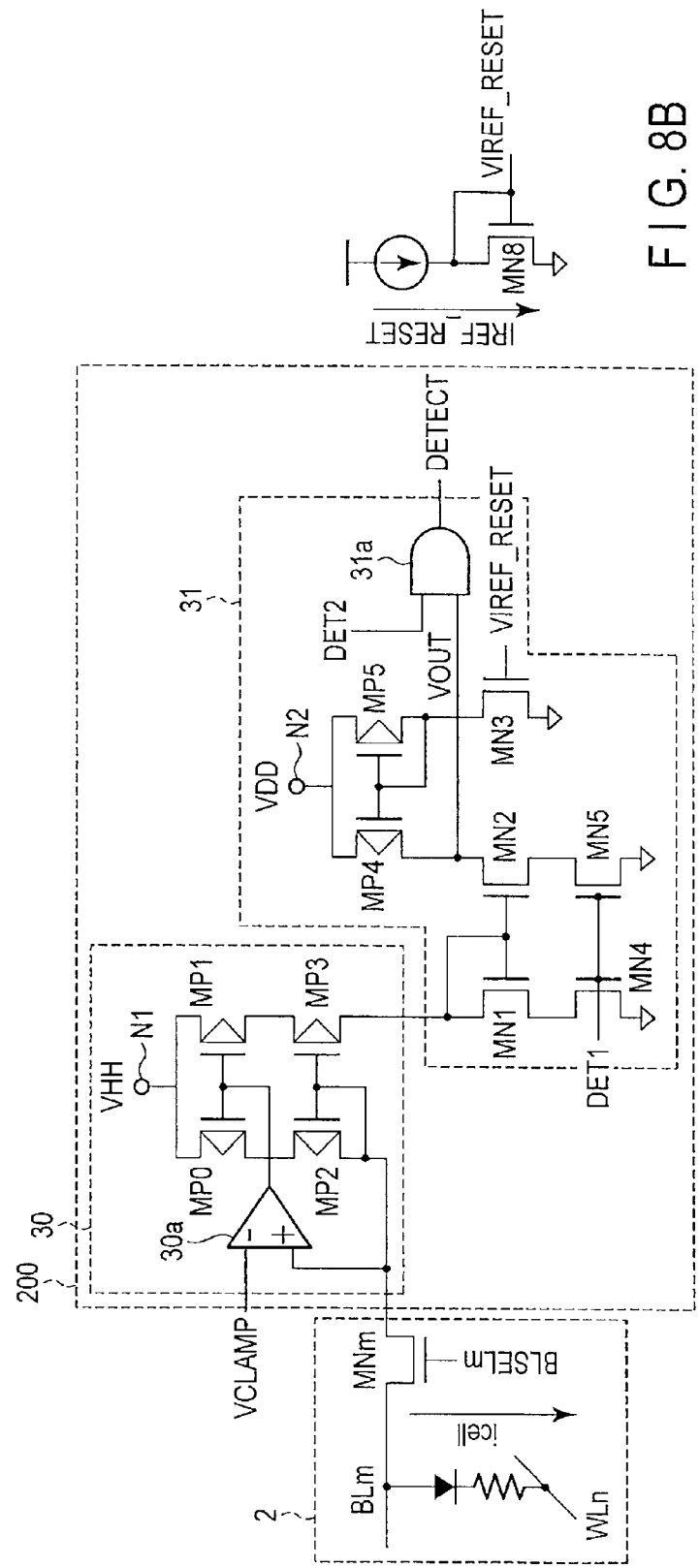
FIG. 8A is a circuit diagram schematically showing a basic configuration of a resistance-change detection circuit as a comparative example and FIG. 8B is a circuit diagram schematically showing a basic configuration of a VIREF_RESET bias generator circuit as a comparative example.

Before the explanation of the second control circuit of the embodiment, a comparative example of the second control circuit 4 will be explained. FIG. 8A is a circuit diagram schematically showing a basic configuration of a resistance-change detection circuit 200 as a comparative example. FIG. 8B is a circuit diagram schematically showing a basic configuration of a VIREF_RESET bias generator circuit as a comparative example.

As shown in FIG. 8A, the resistance-change detection circuit 200 comprises a driver 30 connected to the memory cell array 2 and a detection module 31 connected to the driver 30.

For the sake of simplicity, the memory cell array 2 comprises selected bit line BLm (m being an integer), selected word line WLn (n being an integer), a diode 22 constituting a memory cell at the intersection of bit line BLm and word line WLn, a variable resistance element 24, and a transistor MNm, an n-type MOSFET.

A voltage node is connected to the gate terminal of transistor MNm. Signal BLSELm is applied to the gate terminal of transistor MNm. Bit line BLm is connected to the source terminal of transistor MNm. The drain terminal of transistor MNm is connected to the driver 30. Signal BLSELm is a bit line selection signal and rises to a high voltage VHH according to an externally input address. At the high voltage VHH, signal BLSELm allows voltage VRESET from the driver 30 to be applied to bit line BLm.

At the start of a RESET operation, all the word lines are set to a voltage higher than the bit line voltage so as to prevent current from flowing between the word lines and the selected bit line. All the word lines may be lowered in voltage from the bit line voltage in a leakage allowable range. At the time when the selected bit line BLm has reached voltage VRESET, the selected word line WLn is set to 0 V and cell current icell flows in the selected memory cell.

The driver 30 comprises an operational amplifier 30a and transistors MP0 to MP4, p-type MOSFETs.

A voltage at the source terminal of transistor MP2 is input to the noninverting input (+) of the operational amplifier 30a and voltage VCLAMP is input to the inverting input (−) of the operational amplifier 30a. Voltage VCLAMP, which is a clamp voltage of the bit line, is set to a specific voltage VRESET. Suppose voltage VRESET is a sufficient voltage to cause RESET current to flow in the selected low-resistance memory cell. When voltage VCLAMP has been set to voltage VRESET, the output terminal of the operational amplifier 30a outputs to the gate terminal of transistor MP0 such a voltage as makes the voltage of bit line BLm equal to voltage VRESET.

The output terminal of the operational amplifier 30a is connected to the gate terminal of transistor MP0. Node N1 to which voltage VHH is applied is connected to the drain terminal of transistor MP0. The output terminal of the operational amplifier 30a is connected to the gate terminal of transistor MP1. Node N1 to which voltage VHH is applied is connected to the drain terminal of transistor MP1.

The drain terminal of transistor MP2 is connected to the source terminal of transistor MP0. The source terminal of transistor MP2 is connected to the drain terminal of transistor MNm and the operational amplifier 30a. The source terminal of transistor MP2 is connected to the gate terminal of transistor M22. The drain terminal of transistor MP3 is connected to the source terminal of transistor MP1. The source terminal of transistor MP3 is connected to the detection module 31. The source terminal of transistor MP2 is connected to the gate terminal of transistor MP3. Transistor MP2 and transistor MP3 form a current mirror.

The detection module 31 comprises transistors NM1 to MN5, n-type MOSFETs, transistors MP4, MP5, p-type MOSFETs, and a computation unit 31a, a NAND gate.

Node N2 to which voltage VDD is applied is connected to the drain terminals of transistors MP4, MP5. The source terminal of transistor MP5 is connected to the gate terminals of transistors MP4, MP5.

The drain terminal of transistor MN1 is connected to the source terminal of transistor MP3. The gate terminal of transistor MN1 is connected to the source terminal of transistor MP3. The drain terminal of transistor MN2 is connected to the source terminal of transistor MP4. The gate terminal of transistor MN2 is connected to the source terminal of transistor MP3. Transistor MN1 and transistor MN2 form a current mirror.

The drain terminal of transistor MN3 is connected to the source terminal of transistor MP5. The source terminal of transistor MN3 is connected to the ground. A voltage node is connected to the gate terminal of transistor MN3. Voltage VIREF_RESET is applied to the gate terminal of transistor MN3. The drain terminal of transistor MN4 is connected to the source terminal of transistor MN1. The source terminal of transistor MN4 is connected to the ground. A voltage node is connected to the gate terminal of transistor MN4. Signal DET1 is applied to the gate terminal of transistor MN4. The drain terminal of transistor MN5 is connected to the source terminal of transistor MN2. The source terminal of transistor MN5 is connected to the ground. A voltage node is connected to the gate terminal of transistor MN5. Signal DET1 is applied to the gate terminal of transistor MN5.

The drain voltage VOUT of transistor MN2 and signal DET2 are input to the computation unit 31a, which ANDs these voltages. According to the computation result, the computation module 31a outputs a signal DETECT with an amplitude of 0 V to VDD. The voltage VOUT corresponds the result of comparing cell current icell and reference current IREF_RESET to determine which one of them carries a larger current.

The VIREF_RESET bias generator circuit comprises transistor MN8 and a current source as shown in FIG. 8. The drain terminal of transistor MN8 is connected to the current source. The drain terminal and gate terminal of transistor MN8 are connected to each other. The source terminal of transistor MN8 is grounded. The current source generates current IREF_RESET and causes this current to flow in the drain of transistor MN8. The gate voltage of transistor MN8 is output as voltage VIREF_RESET.

Since voltage VIREF_RESET is applied to the gate of transistor MN3, transistor MN3 also allows reference current IREF_RESET to flow as described above. As a result, reference current IREF_RESET is also allowed to flow through the drain terminal of transistor MN2. If cell current icell is larger than reference current IREF_RESET, voltage VOUT drops. If cell current icell is smaller than reference current IREF_RESET, voltage VOUT rises.

Figure 9:
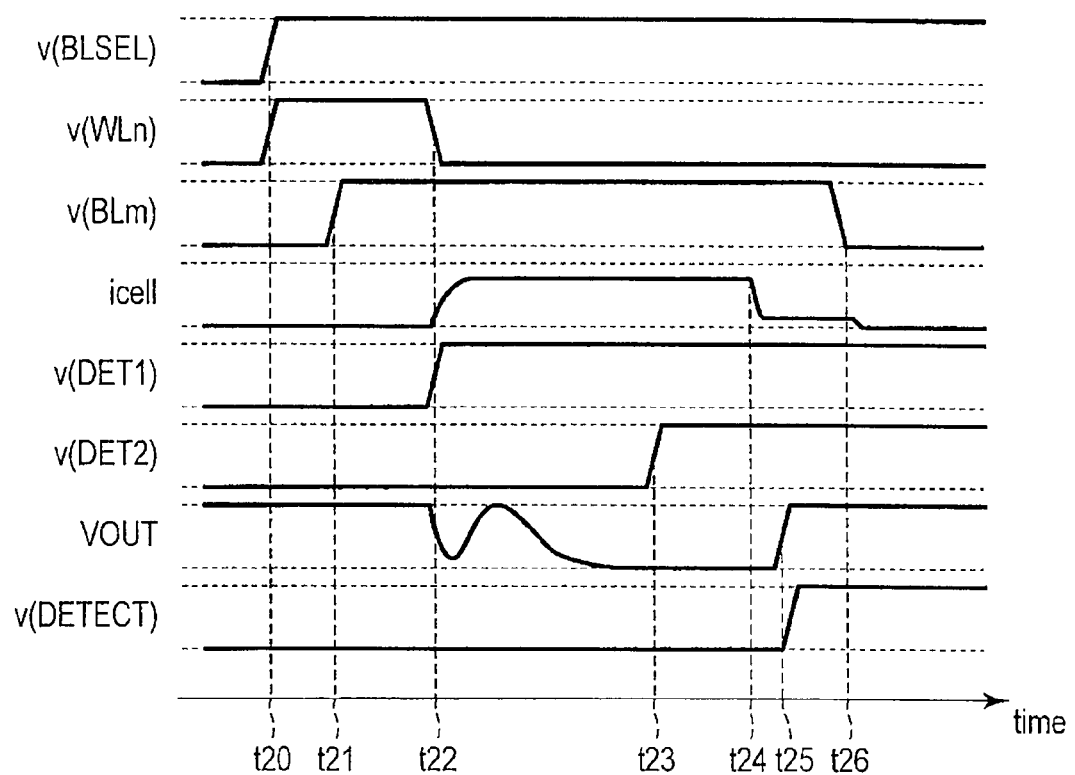
FIG. 9 is a timing chart for the resistance-change detection circuit shown in FIGS. 8A and 8B.

Next, a comparative example of a RESET operation will be explained roughly with reference to FIG. 9. FIG. 9 is a timing chart for the resistance-change detection circuit 200 shown in FIGS. 8A and 8B. The horizontal axis represents elapsed time.

During standby time until time t20, selected word line WLn and selected bit line BLm are in an unselected state. Although reference current IREF_RESET is supplied to the drain of transistor MN2, voltage VOUT remains high because cell current icell does not flow.

At time t20, signal BLSELm at the gate of transistor MNm is made high, making the voltage of the selected word line WLn high.

At time t21, the voltage of the selected bit line BLm is made high. Since the voltage of the selected word line WLn is high, no current flows in the selected memory cell.

At time t22, the voltage of the selected word line WLn is made low (0 V), allowing cell current icell to begin to flow in the selected memory cell. At this time, signal DET1 is changed from low (0 V) to high (VDD) to cause a current equal to cell current icell flowing in transistor MP2 to flow in transistor MP3, transistor MN1, and transistor MN2. At this time, a mirrored cell current icell flows in transistor MN2 and becomes larger than reference current IREF_RESET, which causes voltage VOUT to fall. However, voltage VOUT does not become stable until time t23. Therefore, the selected word line WLn is activated. Immediately after cell current icell has begun to flow, it is necessary to wait for the state of the resistance-change detection circuit 200 to become stable.

At time t23, signal DET2 is changed from the low level to the high level after the time that voltage VOUT has become stable at the low level.

At time t24, the resistance of the selected memory cell changes from the low-resistance state to the high-resistance state and cell current Icell varies. Here, cell current Icell becomes smaller than reference current IREF_RESET.

At time t25, mirror current of cell current icell flowing in transistor MN2 becomes smaller than reference current IREF_RESET, causing voltage VOUT to change from the low level to the high level. Both signal DET2 and voltage VOUT go high, causing the computation unit 31a to output signal DETECT at a high level. Therefore, at time t26, a circuit (not shown) lowers the voltage of the selected bit line BLm to 0 V, preventing a voltage from being applied to the selected memory cell.

The resistance-change detection circuit 200 might cause the following problem. To detect cell current icell accurately, it is necessary to wait for a specific time until voltage VOUT becomes stable to raise signal DET2 from the low level to the high level. The time required for voltage VOUT to become stable is a hundred nanoseconds to several hundreds of nanoseconds, depending on the reset current or bit voltage. During that time, the cell current continues flowing. The reset time needed by the variable resistance element 24 used in a memory cell varies according to materials and conditions for a set operation when the variable resistance element has transitioned to the low-resistance state.

In the comparative example, the selected memory cell changes from the low-resistance state to the high-resistance state after voltage VOUT has become stable. However, it is known that the reset time is sometimes 50 nanoseconds or shorter. That is, the selected memory cell might change from the low-resistance state to the high-resistance state before the stabilization time of voltage VOUT has elapsed. This is called SET disturb after RESET, which is caused as a result of a voltage kept applied to the memory cell even after the memory cell has changed from the low-resistance state to the high-resistance state when RESET current was caused to flow in the memory cell. In this way, when the voltage is kept applied to the selected memory cell until voltage VOUT has become stable, this might permit the memory cell selected by the disturb to change again from the high-resistance state to the low-resistance state. Therefore, it is difficult to perform a stable RESET operation.

(5) Second Control Circuit 4 of the Embodiment

Next, a resistance-change detection circuit 100 included in the second control circuit 4 according to the embodiment will be explained in detail with reference to FIGS. 6A and 6B. FIG. 6A is a circuit diagram schematically showing a basic configuration of the resistance-change detection circuit 100 of the embodiment. FIG. 6B is a circuit diagram schematically showing a basic configuration of a VIREF_RESET bias generator circuit and a VDMY bias generator circuit according to the embodiment. The VIREF_RESET bias generator circuit and VDMY bias generator circuit may be included in the second control circuit 4 or provided outside the second control circuit and inside the memory 1.

As shown in FIG. 6A, the resistance-change detection circuit 100 comprises a driver 30 connected to the memory cell array 2, a detection module 31 connected to the driver 30, and a dummy current module (a current supplying module) 32 connected to the driver 30. That is, the resistance-change detection circuit 100 is so configured that the dummy current module 32 is added to the resistance-change detection circuit 200 in the comparative example. The remaining configuration and basic operation are the same as described above. Therefore, a detailed explanation of them will be omitted.

The dummy current module 32 comprises transistors MN6 and MN7, n-type MOSFETs, and a computation unit 32a.

The drain terminal of transistor MN6 is connected to the source terminal of transistor MP2. A voltage node is connected to the gate terminal of transistor MN6. Voltage VDMY is applied to the gate terminal of transistor MN6. The drain terminal of transistor MN7 is connected to the source terminal of transistor MN6. The source terminal of transistor MN7 is connected to the ground. A voltage node is connected to the gate terminal of transistor MN6. Voltage DET1A is applied to the gate terminal of transistor MN6. Transistor MN6 and transistor MN1 form a current mirror.

Signal DET1 and inverted signal DET2 are input to the computation unit 32a, which ANDs these signals. According to the computational result, the computation unit 32a outputs signal DET1A with an amplitude of 0 V to VDD.

The VDMY bias generator circuit comprises transistor MN9 and a current source as shown in FIG. 6B. Transistor MN9 has its drain terminal connected to the current source, its drain terminal and gate terminal connected to each other, and its source terminal grounded. The current source generates dummy current idummy and causes the dummy current to flow in the drain of transistor MN9. The gate voltage of transistor MN9 is output as voltage VDMY. Dummy current idummy, which is larger than reference current IREF_RE- SET, is set to, for example, an integer multiple of reference current IREF_RESET and functions as a dummy of cell current. Dummy current idummy does not exceed the maximum cell current icell in the low-resistance state. Here, the maximum cell current in the low-resistance state is a statistical value of a cell current that varies from cell to cell.

The detection module 31 comprises transistor MN1 that receives current corresponding to cell current icell and transistor MN2 that forms a current mirror circuit together with transistor MN1 and is connected to an output node of the detection module 31. When the dummy current module 32 supplies dummy current idummy, transistor MN1 receives dummy current idummy in place of cell current icell. The driver 30 comprises transistor MP2 that supplies cell current icell to memory cell CUs and transistor MP3 that forms a current mirror circuit together with transistor MP2 and supplies cell current icell. The dummy current module 32 includes transistor MP0 that supplies dummy current idummy. Transistor MN1 of the detection module 31 receives cell current icell. When transistor MP0 of the dummy current module 32 is turned on, dummy current idummy is caused to flow in transistor MP3.

(6) Operation

Next, an operation of the resistance-change memory will be explained with reference to FIG. 3.

(6-1) Summary of Operation

First, a data read operation of the variable resistance element 24 will be explained briefly. A data read operation is performed by applying, for example, a read voltage (Vread) pulse to the selected variable resistance element 24 and detecting a current determined by the resistance of the variable resistance element 24. The voltage pulse preferably has such a small amplitude that prevents the material of the variable resistance element 24 from changing its state.

This is done by applying, for example, a read voltage from bit line BL to the selected memory cell and measuring the current at that time with a sense amplifier.

Next, a data write operation of the variable resistance element 24 will be explained briefly.

The variable resistance element 24 can be caused to transition to the low-resistance state (LRS) by applying a set voltage (Vset) pulse to the variable resistance element 24 in the high-resistance state (HRS). Causing the variable resistance element 24 to transition from the high-resistance state to the low-resistance state is called SET.

In addition, the variable resistance element 24 can be caused to transition to the high-resistance state, a written state, by applying a reset (Vreset) pulse to the variable resistance element 24 in the low-resistance state. Causing the variable resistance element 24 to transition from the low-resistance state to the high-resistance state is called RESET.

In the embodiment, data is recorded in two levels, provided that the variable resistance element 24 in the low-resistance state is set as a "1" written state and the variable resistance element 24 in the high-resistance state is set as a "0" written state. In addition, let the resistance of the variable resistance element 24 in the low-resistance state be Ron and the resistance of the variable resistance element 24 in the high-resistance state be Roff. Roff is more than three times higher in resistance than Ron. In RESET, when the variable resistance element 24 changes from the low-resistance state to the high-resistance state, the bit line current decreases accordingly. Whether "0" and "1" are allocated to either the low-resistance state or the high-resistance state is arbitrary.

(6-2) Details Of Operation

Next, a RESET operation in the embodiment will be explained in detail with reference to FIG. 7, particularly centering on the operation of the resistance-change detection circuit 100. FIG. 7 is a timing chart showing variations in voltage v(BLSEL) of signal BLSEL, voltage v(WLn) of word line WLn and voltage v(BLm) of bit line BLm, cell current icell, voltage v(DET1) of signal DET1, voltage v(DET2) of signal DET2, and voltage v(DET1A) of signal DET1A, dummy current idummy, output voltage VOUT, and voltage v(DETECT) of signal DETECT with respect to time in the resistance-change detection circuit 100 shown in FIGS. 6A and 6B. The horizontal axis represents elapsed time.

During standby until time t10, the selected word line WLn and selected bit line BLm are unselected. Although reference current IREF_RESET is supplied to the drain of transistor MN2, voltage VOUT is high because cell current icell does not flow. Voltage VDMY is supplied to the gate terminal of transistor MN6.

At time t10, the second control circuit 4 makes signal BLSEL at the gate of transistor MNm high (VHH). The first control circuit 3 makes the voltage v(WLn) of the selected word line WLn high.

At time t11, the second control circuit 4, more specifically, the driver 30, makes voltage v(BLm) of the selected bit line BLm high. Here, although the bit line has risen to the VRESET level, no current flows in the selected memory cell because the voltage of the selected word line WLn is high. At the same time, for example, the state machine 8 raises signal DET1 from the low level to the high level (VDD). Therefore, transistor MN4 and transistor MN5 are turned on. At this time, the state machine 8 sets the voltage of signal DET2 at the low level (0 V). Accordingly, the output DET1A of the computation unit 32a is at the high level (VDD). Therefore, transistor MN7 is turned on, causing dummy current idummy to flow in transistor MN6.

Here, transistor MN1, together with transistor MN6, forms a current mirror. Therefore, a current similar to dummy current idummy flows in transistor MN1. In addition, a current similar to dummy current idummy also flows in transistor MN2 constituting a current mirror together with transistor MN1.

Voltage VOUT fluctuates, depending on whether reference current IREF_RESET is larger than dummy current idummy or vice versa in the drain of transistor MN2. Specifically, when dummy current idummy is larger than reference current IREF_RESET, transistors MN2, MN5 cause voltage VOUT to fall. When dummy current idummy is smaller than reference current IREF_RESET, the drain terminal of transistor MN2 is connected electrically to VDD via transistor MP4, raising voltage VOUT.

With the VIREF_RESET bias generator circuit and VDMY bias generator circuit according to the embodiment, dummy current idummy is set so as to be larger than reference current IREF_RESET. Therefore, at time t11, voltage VOUT falls. However, until time t12, voltage VOUT does not become stable. Dummy current idummy, which is set to an integer multiple of reference current IREF_RESET, functions as a dummy of cell current. The time from the rising of DET1 to the falling of the selected word line can be secured as long as the time required to stabilize voltage VOUT.

At time t12, signal DET2 is raised from the low level to the high level. Then, since signal DET1 is high and signal DET2 is high (VDD) (which is inverted, producing the low level), the computation unit 32a outputs a low-level (or 0-V) signal DET1A. This turns off transistor MN7, preventing dummy current idummy from being supplied.

Then, the first control circuit 3 sets the voltage of the selected word line WLn to the low level (0 V), activating the selected word line WLn, which causes cell current icell to start to flow in the selected memory cell. At this time, for example, the state machine 8 raises signal DET1 from the low level (0 V) to the high level (VDD) to cause a current equal to cell current icell flowing in transistor MP2 to flow in transistor MP3, transistor MN1, and transistor MN2. At this time, the mirrored cell current icell flows in transistor MN2, exceeding reference current IREF_RESET, which lowers voltage VOUT.

At this time, since dummy current idummy is flowing in transistor MN2 before the supply of cell current icell, voltage VOUT is almost stable. Therefore, the selected word line WLn is activated. Immediately after cell current icell starts to flow, the computation unit 31a can detect a change in the cell current icell (a change in voltage VOUT).

At time t13, the resistance of the selected memory cell changes from the low to high, changing cell current icell. Here, cell current icell becomes smaller than reference current IREF_RESET, changing voltage VOUT from the low level to the high level.

At time t14, signal DET2 and voltage VOUT both go high, causing the computation unit 31a to output signal DETECT at a high level. Therefore, a circuit (not shown) lowers the voltage of the selected bit line BLm to 0 V, applying no voltage to the selected memory cell.

(7) Effects of the Embodiment

As described above, the configuration of the embodiment produces the effect of suppressing the application of a voltage to the selected memory cell even after the resistive state of the memory cell has changed. This will be explained in detail below.

In the embodiment, the nonvolatile semiconductor memory device comprises a memory cell array 2 where memory cells CUs, each including a variable resistance element 24 and a current-limiting element (diode) 22 that has a nonlinear current-voltage characteristic, are arranged in a matrix, a driver 30 that changes the resistance of the variable resistance element 24 by causing cell current icell to flow in a memory cell CUs, a detection module 31 that detects a change in the resistance of a memory cell CUs on the basis of the magnitude of current, and a dummy current module 32 that causes dummy current idummy different from cell current icell to flow in the detection module 31 in place of cell current icell.

The detection module 31 compares reference current IREF_RESET with cell current icell. If cell current icell has become smaller than reference current IREF_RESET, the driver 30 is caused to stop the supply of cell current icell.

The embodiment comprises a current path composed of transistor MN6, an n-type MOSFET, connected to the driver 30, a VDMY bias generator circuit that includes a node to which voltage VDMY that determines the magnitude of dummy current idummy is applied, and a computation unit (logic gate) 32a that outputs signal DET1A for controlling the timing with which dummy current idummy flows.

With the above configuration, before cell current icell is caused to flow, dummy cell current (dummy current) idummy that uses a reference current for detecting the RESET of the selected memory cell is supplied to transistor MN2. That is, before the cell current is caused to flow in a bit line, the detection module 31 is operated by the dummy current, thereby stabilizing voltage VOUT beforehand.

After the word line is activated, dummy current idummy is stopped and cell current icell is actually caused to flow in the selected memory cell. At this time, voltage VOUT at the output node of the detection module 31 is already stable (at the low level). That is, the resistance-change detection circuit 100 can detect the resistance immediately after the word line is activated.

Therefore, although the time required to stabilize voltage VOUT has ranged from one hundred nanoseconds to several hundreds of nanoseconds since the cell current started to flow, the time can be shortened remarkably. This makes it possible to quickly detect a change in the resistive state of the selected memory even when the time required for the selected memory cell to change from the low-resistance state to the high-resistance state (RESET time) is short.

As a result, even after the resistive state of the selected memory cell has changed, the application of a voltage to the memory cell can be suppressed and the state of the memory cell selected by disturb can be prevented from changing again from the high-resistance state to the low-resistance state.

The aforementioned embodiment is not the only embodiment and may be modified variously. For example, while in the embodiment, an example of the resistance-change detection circuit has been explained with reference to FIGS. 6A and 6B, any structure may be used, provided that dummy current idummy is caused to flow in the detection module 31 before cell current icell is caused to flow in the detection module 31 in order to stabilize voltage VOUT used in detecting a change in cell current icell.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a memory cell which includes a variable resistance element and a current-limiting element that has a nonlinear current-voltage characteristic;
    a current driver;
    a detection module;
    a reference current supplying module; and
    a stabilizing current supplying module,
    wherein the reference current supplying module causes a first current to flow in the detection module, before the stabilizing current supplying module causes a second current to flow in the detection module,
    the stabilizing current supplying module causes the second current to flow in the detection module, before the current driver causes a third current to flow in the memory cell,
    the current driver changes the resistance of the variable resistance element, after stopping the third current, from low-resistance state to high-resistance state by causing the third current to flow in the memory cell, and
    the detection module compares the first current with the third current, causes the current driver to stop the third current if the third current has become less than or equal to the first current, and detects a change in the resistance of the memory cell based on the magnitude of the third current.

2. The nonvolatile semiconductor memory device of claim 1, wherein the second current is larger than the first current.

3. The nonvolatile semiconductor memory device of claim 2, wherein the second current does not exceed the largest value of the third current.

4. The nonvolatile semiconductor memory device of claim 1, wherein the detection module includes
    a first transistor which supplies a current corresponding to the third current, and
    a second transistor which, together with the first transistor, forms a current mirror circuit and is connected to an output node of the detection module, and
    the first transistor supplies the second current in place of the third current when the current supplying module supplies the second current.

5. The nonvolatile semiconductor memory device of claim 4, wherein the current driver includes
    a third transistor which supplies the third current to the memory cell, and
    a fourth transistor which, together with the third transistor, forms a current mirror circuit and supplies the third current,
    the current supplying module includes a fifth transistor which supplies the second current, and
    the second current is caused to flow in the third transistor when the fifth transistor of the current supplying module is turned on.

6. The nonvolatile semiconductor memory device of claim 5, wherein the detection module further includes
    a sixth transistor to one end of whose current path a power supply voltage is applied and to the other end of whose current path the second transistor is connected,
    a seventh transistor which, together with the sixth transistor, forms a current mirror circuit and to one end of whose current path the power supply voltage is applied, and
    an eighth transistor one end of whose current path is connected to the other end of the current path of the seventh transistor and which causes first current to flow.

7. The nonvolatile semiconductor memory device of claim 6, wherein the current driver is caused to stop the third current when the third current has become less than or equal to the first reference current.

8. The nonvolatile semiconductor memory device of claim 7, wherein the detection module further includes a first computation unit that has a first input terminal to which a current between the second transistor and the sixth transistor is input and a second input terminal to which a first signal is input, and the output of the first computation unit causes the current driver to stop the third current.

9. The nonvolatile semiconductor memory device of claim 8, wherein the current supplying module includes
    a second computation unit that has a first input terminal to which the inversion of the first signal is input and a second input terminal to which a second signal is input, and
    a ninth transistor one end of whose current path is connected to one end of the current path of the fifth transistor and the other end of whose current path is connected to the ground potential and to whose gate the output of the second computation unit is input.

10. The nonvolatile semiconductor memory device of claim 9, wherein the first signal is set to a first level and the second signal is set to a second level obtained by relatively inverting the first level, thereby causing the second computation unit to turn on the ninth transistor and further causing the second current to flow in the fifth transistor.

11. The nonvolatile semiconductor memory device of claim 9, wherein the first signal is caused to change, thereby causing the second computation unit to turn off the ninth transistor to stop the second current flowing in the fifth transistor.

12. The nonvolatile semiconductor memory device of claim 1, wherein the current-limiting element is a diode.

13. The nonvolatile semiconductor memory device of claim 1, wherein the variable resistance element is transition metal oxide or additive-doped metal oxide.

14. The nonvolatile semiconductor memory device of claim 13, wherein the transition metal oxide is hafnia, zirconia, nickel oxide, manganese oxide, titania, or tantalum oxide.

15. A method of controlling a nonvolatile semiconductor memory device, the method comprising:
   causing a first current to flow in a detection module, before causing a second current to flow in the detection module,
   causing the second current to flow in the detection module which detects a change in the resistance of a memory cell that includes a variable resistance element and a current-limiting element that has a nonlinear current-voltage characteristic;
   causing a third current to flow in the memory cell after stopping the second current, and
   stopping the third current when detecting a change in the resistance of the variable resistance element based on the magnitude of the third current,
   wherein the resistance of the variable resistance element is changed from a low-resistance state to a high-resistance state by causing the third current to flow in the memory cell.

16. The method of claim 15, further comprising:
   comparing the first a current with the third current; and
   stopping the third current when the third current has become less than or equal to the first current.

17. The method of claim 15, further comprising:
   comparing a first voltage with a second voltage generated by a current mirror circuit at its output node based on the third current after causing the third current to flow in the memory cell; and
   stopping the third current when the second voltage has become less than or equal to the first voltage.

* * * * *